US010380935B2

(12) United States Patent
Liao et al.

(10) Patent No.: US 10,380,935 B2
(45) Date of Patent: Aug. 13, 2019

(54) THIN FILM TRANSISTOR, ARRAY SUBSTRATE, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Liqing Liao, Beijing (CN); Hongmin Li, Beijing (CN); Ping Song, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 150 days.

(21) Appl. No.: 15/717,419

(22) Filed: Sep. 27, 2017

(65) Prior Publication Data
US 2018/0240395 A1   Aug. 23, 2018

(30) Foreign Application Priority Data
Feb. 17, 2017  (CN) .......................... 2017 1 0086206

(51) Int. Cl.
| G11C 19/00 | (2006.01) |
| G09G 3/20  | (2006.01) |
| G11C 19/28 | (2006.01) |
| G09G 3/36  | (2006.01) |

(52) U.S. Cl.
CPC ............. *G09G 3/2092* (2013.01); *G09G 3/20* (2013.01); *G11C 19/28* (2013.01); *G09G 3/3677* (2013.01); *G09G 2300/043* (2013.01); *G09G 2300/0408* (2013.01); *G09G 2310/0267* (2013.01); *G09G 2310/0286* (2013.01);
(Continued)

(58) Field of Classification Search
None
See application file for complete search history.

(56) References Cited

U.S. PATENT DOCUMENTS

| 2015/0179277 A1* | 6/2015 | Pai ........................... G09G 3/20 377/68 |
| 2017/0193887 A1* | 7/2017 | Wang .................... G09G 3/2092 |
| 2018/0182299 A1* | 6/2018 | Li ......................... G09G 3/3266 |

(Continued)

*Primary Examiner* — Tuan T Lam
(74) *Attorney, Agent, or Firm* — Brooks Kushman P.C.

(57) ABSTRACT

The present disclosure provides a gate driving circuit, a gate driving method and a display method. The gate driving circuit includes a pull-up node control circuitry, a pull-down node control circuitry, a display storage circuitry, a compensation storage circuitry and a compensation storage control circuitry. The compensation storage control circuitry is connected to an input terminal, a pull-down control voltage terminal, a pull-up node, a pull-down node, and a second terminal of the compensation storage circuitry, and configured to enable the pull-down control voltage terminal to be electrically connected to the second terminal of the compensation storage circuitry under the control of the input terminal so as to charge the compensation storage circuitry, and enable the second terminal of the compensation storage circuitry to be electrically connected to the pull-up node.

18 Claims, 6 Drawing Sheets

(52) U.S. Cl.
CPC . *G09G 2310/0289* (2013.01); *G09G 2310/08* (2013.01); *G09G 2330/023* (2013.01)

(56) References Cited

U.S. PATENT DOCUMENTS

| | | | |
|---|---|---|---|
| 2018/0182334 A1* | 6/2018 | Li | G09G 3/3674 |
| 2018/0315389 A1* | 11/2018 | Hong | G11C 19/28 |
| 2018/0329547 A1* | 11/2018 | Wu | G11C 19/28 |

* cited by examiner

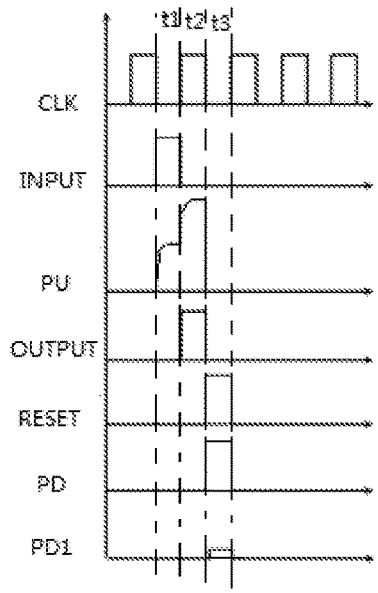

Fig. 9

| at the input stage, a high level is output by the pull-down control voltage terminal, and the pull-down control voltage terminal is controlled by the compensation storage control circuitry to be electrically connected to the second terminal of the compensation storage circuitry under the control of the input terminal, so as to charge the compensation storage circuitry | S1 |

↓

| at the output stage, a high level is output by the pull-down control voltage terminal to output, the pull-down node is controlled by the pull-down node control circuitry to be electrically connected to the pull-down control voltage terminal in the case that the potential at the pull-up node is smaller than a predetermined potential, so as to control the potential at the pull-down node to be a high level, and the second terminal of the compensation storage circuitry is controlled by the compensation storage control circuitry to be electrically connected to the pull-up node in the case that the potential at the pull-down node is a high level, so as to pull up the potential at the pull-up node through the compensation storage circuitry | S2 |

Fig. 10

THIN FILM TRANSISTOR, ARRAY SUBSTRATE, DISPLAY PANEL AND DISPLAY DEVICE

CROSS-REFERENCE TO RELATED APPLICATION

This application claims priority to Chinese Patent Application No. 201710086206.4 filed on Feb. 17, 2017, which is incorporated herein by reference in its entirety.

TECHNICAL FIELD

The present disclosure relates to the field of display diving technology, in particular to a gate driving circuit, a gate driving method and a display device.

BACKGROUND

Along with development of the display technology, there is a higher and higher requirement on reliability of a display panel, and there are more and more problems for a conventional gate on array (GOA) circuit operated in a severe environment. For example, in a high-temperature and high-humidity environment, a characteristic of a thin film transistor (TFT) of the GOA circuit may change or leakage current of the TFT in an off-state may increase remarkably. In this regard, a charge-sustaining characteristic may be deteriorated due to leakage of a display storage circuitry at an output stage of a gate driving signal. At this time, a potential at a pull-up node maintained by the display storage circuitry cannot be kept as a high level, so that it is impossible for the GOA circuit to output the gate driving signal normally.

SUMMARY

A main object of the present disclosure is to provide a gate driving circuit, a gate driving method and a display device.

In one aspect, the present disclosure provides in some embodiments a gate driving circuit, including: a pull-up node control circuitry connected to an input terminal, a pull-up node and a pull-down node; a pull-down node control circuitry connected to a pull-down control voltage terminal, the pull-up node and the pull-down node; a display storage circuitry, a first terminal of which is connected to the pull-up node and a second terminal of which is connected to a gate driving signal output terminal; a compensation storage circuitry, a first terminal of which is connected to the gate driving signal output terminal; and a compensation storage control circuitry. The pull-down node control circuitry is configured to enable the pull-down node to be electrically connected to the pull-down control voltage terminal, so as to control a potential at the pull-down node to be a high level. The compensation storage control circuitry is connected to the input terminal, the pull-down control voltage terminal, the pull-up node, the pull-down node and a second terminal of the compensation storage circuitry, and configured to enable the pull-down control voltage terminal to be electrically connected to the second terminal of the compensation storage circuitry under the control of the input terminal so as to charge the compensation storage circuitry, and enable the second terminal of the compensation storage circuitry to be electrically connected to the pull-up node.

In a possible embodiment of the present disclosure, the pull-down node control circuitry is further configured to, in the case that a potential at the pull-up node is smaller than a predetermined potential, enable the pull-down node to be electrically connected to the pull-down control voltage terminal at an output stage, so as to control the potential at the pull-down node to be a high level, and the compensation storage control circuitry is further configured to enable the pull-down control voltage terminal to be electrically connected to the second terminal of the compensation storage circuitry under the control of the input terminal at an input stage so as to charge the compensation storage circuitry, and in the case that the potential at the pull-down node is a high level, enable the second terminal of the compensation storage circuitry to be electrically connected to the pull-up node at the output stage.

In a possible embodiment of the present disclosure, the compensation storage control circuitry includes: a first compensation storage control transistor, a gate electrode of which is connected to the input terminal, a first electrode of which is connected to the second terminal of the compensation storage circuitry, and a second electrode of which is connected to the pull-down control voltage terminal; and a second compensation storage control transistor, a gate electrode of which is connected to the pull-down node, a first electrode of which is connected to the pull-up node, and a second electrode of which is connected to the pull-down control voltage terminal.

In a possible embodiment of the present disclosure, the first compensation storage control transistor and the second compensation storage control transistor are both n-type transistors.

In a possible embodiment of the present disclosure, the pull-up node control circuitry is further connected to a reset terminal, and the compensation storage control circuitry is further connected to the reset terminal and configured to enable the second terminal of the compensation storage circuitry to be electrically disconnected from the pull-up node under the control of the reset terminal at a reset stage.

In a possible embodiment of the present disclosure, the compensation storage control circuitry includes: a first compensation storage control transistor, a gate electrode of which is connected to the input terminal, a first electrode of which is connected to the second terminal of the compensation storage circuitry, and a second electrode of which is connected to the pull-down control voltage terminal; a second compensation storage control transistor, a gate electrode of which is connected to a compensation control node, a first electrode of which is connected to the pull-up node, and a second electrode of which is connected to the pull-down control voltage terminal; a third compensation storage control transistor, a gate electrode and a first electrode of which are connected to the pull-down node, and a second electrode of which is connected to the compensation control node; and a fourth compensation storage control transistor, a gate electrode of which is connected to the reset terminal, a first electrode of which is connected to the compensation control node, and a second electrode of which is connected to a first low level output terminal.

In a possible embodiment of the present disclosure, at the reset stage, a potential at the compensation control node is controlled in accordance with a width-to-length ratio of the third compensation storage control transistor and a width-to-length ratio of the fourth compensation storage control transistor.

In a possible embodiment of the present disclosure, the first compensation storage control transistor, the second compensation storage control transistor, the third compensation storage control transistor and the fourth compensation storage control transistor are all n-type transistors.

In a possible embodiment of the present disclosure, the compensation storage circuitry includes a compensation capacitor.

In a possible embodiment of the present disclosure, the pull-down node control circuitry is further configured to enable the pull-down node to be electrically connected to a first low level input terminal in the case that the potential at the pull-up node is greater than the predetermined potential, and control the pull-down node to be electrically connected to the pull-down control voltage terminal in the case that the potential at the pull-up node is smaller than a predetermined potential and the pull-down control voltage terminal outputs a high level.

In a possible embodiment of the present disclosure, the pull-down node control circuitry includes: a first pull-down control transistor, a gate electrode of which is connected to the pull-up node, a first electrode of which is connected to the pull-down node, and a second electrode of which is connected to the first low level input terminal; a second pull-down control transistor, a gate electrode of which is connected to the pull-up node, a first electrode of which is connected to a pull-down control node, and a second electrode of which is connected to the first low level input terminal; a third pull-down control transistor, a gate electrode and a first electrode of which are connected to the pull-down control voltage terminal, and a second electrode of which is connected to the pull-down control node; and a fourth pull-down control transistor, a gate electrode of which is connected to the pull-down control node, a first electrode of which is connected to the pull-down control voltage terminal, and a second electrode of which is connected to the pull-down node.

In a possible embodiment of the present disclosure, the gate driving circuit further includes a start circuitry connected to a start terminal and the pull-down node, and configured to, prior to an input stage, control the potential at the pull-down node to be a high level under the control of the start terminal, so as to denoise the pull-up node and the gate driving signal output terminal.

In a possible embodiment of the present disclosure, the gate driving circuit further includes an output circuitry connected to the pull-up node, the pull-down node, the gate driving signal output terminal, a first low level output terminal and a clock signal connection terminal, and configured to enable the gate driving signal output terminal to be electrically connected to the first low level output terminal and/or the clock signal connection terminal under the control of the pull-up node and the pull-down node.

In another aspect, the present disclosure provides in some embodiments a gate driving method for the above-mentioned gate driving circuit. A display duration of one frame includes the input stage and the output stage. The gate driving method includes following steps: at the input stage, outputting, by the pull-down control voltage terminal, a high level, and controlling, by the compensation storage control circuitry, the pull-down control voltage terminal to be electrically connected to the second terminal of the compensation storage circuitry under the control of the input terminal, so as to charge the compensation storage circuitry; and at the output stage, outputting, by the pull-down control voltage terminal, a high level, controlling, by the pull-down node control circuitry, the pull-down node to be electrically connected to the pull-down control voltage terminal in the case that the potential at the pull-up node is smaller than the predetermined potential, so as to control the potential at the pull-down node to be a high level, and controlling, by the compensation storage control circuitry, the second terminal of the compensation storage circuitry to be electrically connected to the pull-up node in the case that the potential at the pull-down node is a high level, so as to pull up the potential at the pull-up node through the compensation storage circuitry.

In yet another aspect, the present disclosure provides in some embodiments a gate driving method for the above-mentioned gate driving circuit. A display duration of one frame includes the input stage, the output stage and the reset stage. The gate driving method includes following steps: at the input stage, outputting, by the pull-down control voltage terminal, a high level, and controlling, by the compensation storage control circuitry, the pull-down control voltage terminal to be electrically connected to the second terminal of the compensation storage circuitry under the control of the input terminal, so as to charge the compensation storage circuitry; at the output stage, outputting, by the pull-down control voltage terminal, a high level, controlling, by the pull-down node control circuitry, the pull-down node to be electrically connected to the pull-down control voltage terminal in the case that the potential at the pull-up node is smaller than a predetermined potential, so as to control the potential at the pull-down node to be a high level, and controlling, by the compensation storage control circuitry, the second terminal of the compensation storage circuitry to be electrically connected to the pull-up node in the case that the potential at the pull-down node is a high level, so as to pull up the potential at the pull-up node through the compensation storage circuitry; and at the reset stage, controlling, by the compensation storage control circuitry, the compensation control node to be electrically disconnected from the pull-down node under the control of the reset terminal.

In a possible embodiment of the present disclosure, the gate driving method further includes: at the reset stage, outputting the pull-down control voltage terminal, a high level, and under the control of the reset terminal, controlling, by the pull-up node control circuitry, the potential at the pull-up node to be a low level and controlling, by the pull-down node control circuitry, the pull-down node to be electrically connected to the pull-down control voltage terminal, so as to control the potential at the pull-down node to be a high level.

In a possible embodiment of the present disclosure, the gate driving method further includes: subsequent to the reset stage, outputting, by the pull-down control voltage terminal, a low level, controlling, by the pull-down node control circuitry, the potential at the pull-down node to be a low level, and controlling, by the compensation storage control circuitry, the second terminal of the compensation storage circuitry to be electrically disconnected from the pull-up node.

In still yet another aspect, the present disclosure provides in some embodiments a display device including the above-mentioned gate driving circuit.

BRIEF DESCRIPTION OF THE DRAWINGS

FIG. 9 is a sequence diagram of the gate driving circuit in FIG. 7 in the case that it operates normally.

FIG. 10 is a flow chart of a gate driving method according to some embodiments of the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors involved in the embodiments of the present disclosure may be TFTs, or field effect transistors (FETs) or any other elements having an identical characteristic. In the embodiments of the present disclosure, in order to differentiate two electrodes of each transistor apart from a gate electrode, one of them is called as a first electrode, and the other is called as a second electrode. In actual use, the first electrode may be drain electrode and the second electrode may be source electrode, or the first electrode may be source electrode and the second electrode may be drain electrode. For a gate driving circuit in the embodiments of the present disclosure, n-type transistors are taken as an example, and it should be appreciated that, p-type transistors may also be applied.

Figure 1:
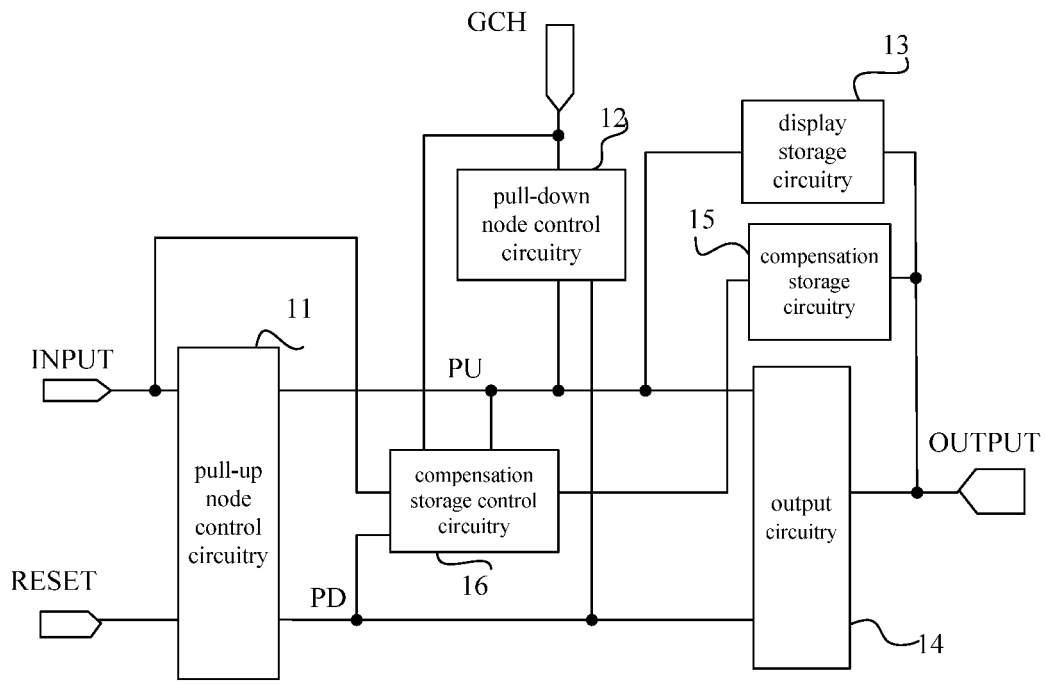
FIG. 1 is a schematic view showing a gate driving circuit according to some embodiments of the present disclosure.

The present disclosure provides in some embodiments a gate driving circuit which, as shown in FIG. 1, includes a pull-up node control circuitry 11, a pull-down node control circuitry 12, a display storage circuitry 13, an output circuitry 14, a compensation storage circuitry 15 and a compensation storage control circuitry 16.

The pull-up node control circuitry 11 is connected to an input terminal INPUT, a reset terminal RESET, a pull-up node PU and a pull-down node PD. The pull-down node control circuitry 12 is connected to a pull-down control voltage terminal GCH, the pull-up node PU and the pull-down node PD. A first terminal of the display storage circuitry 13 is connected to the pull-up node PU and a second terminal thereof is connected to a gate driving signal output terminal OUTPUT. A first terminal of the compensation storage circuitry 15 is connected to the gate driving signal output terminal OUTPUT.

The pull-down node control circuitry 12 is configured to enable the pull-down node PD to be electrically connected to the pull-down control voltage terminal GCH at an output stage. To be specific, the pull-down node control circuitry 12 is configured to, in the case that a potential at the pull-up node PU is smaller than a predetermined potential, control the pull-down node PD to be electrically connected to the pull-down control voltage terminal GCH, so as to control a potential at the pull-down node to be a high level.

The compensation storage control circuitry 16 is connected to the input terminal INPUT, the pull-down control voltage terminal GCH, the pull-up node PU, the pull-down node PD and a second terminal of the compensation storage circuitry 15. The compensation storage control circuitry 16 is configured to, at the output stage, enable the second terminal of the compensation storage circuitry 15 to be electrically connected to the pull-up node PU, and may further configured to enable the pull-down control voltage terminal GCH to be electrically connected to the second terminal of the compensation storage circuitry 15. To be specific, the compensation storage control circuitry 16 is configured to, at the output stage, control the pull-down control voltage terminal GCH to be electrically connected to the second terminal of the compensation storage circuitry 16 under the control of the input terminal INPUT so as to charge the compensation storage circuitry 15, and control the second terminal of the compensation storage circuitry 15 to be electrically connected to the pull-up node PU in the case that the potential at the pull-down node PD is a high level.

In actual use, the output circuitry 14 is connected to the pull-up node PU, the pull-down node PD, the gate driving signal output terminal OUTPUT, a clock signal input terminal CK and a first low level input terminal for outputting a first low level VGL, and configured to enable the gate driving signal output terminal OUTPUT to be electrically connected to the clock signal input terminal CK and/or the first low level input terminal under the control of the pull-up node PU and the pull-down node PD.

During the implementation, the predetermined potential may be a threshold voltage of a pull-up transistor of the output circuitry 14.

According to the gate driving circuit in the embodiments of the present disclosure, the compensation storage circuitry 15 and the compensation storage control circuitry 16 are added. The compensation storage control circuitry 16 is configured to, at the input stage, charge the compensation storage circuitry 15 through the pull-down control voltage terminal GCH, and at the output stage, in the case that the potential at the pull-up node PU is smaller than the predetermined potential (i.e., the current leakage occurs for the display storage circuitry 13), enable the compensation storage circuitry 15 to be connected in parallel to the display storage circuitry 13, so as to compensate for the current leakage of the display storage circuitry 13, thereby pulling up the potential at the pull-up node PU to a high level and achieve the normal output of the gate driving signal.

To be specific, the compensation storage control circuitry 16 may include a first compensation storage control transistor configured to, at the input stage, charge the compensation storage circuitry 15 through the pull-down control voltage terminal GCH, and at the output stage, in the case that the potential at the pull-up node PU is smaller than the predetermined potential (i.e., the current leakage occurs in the display storage circuitry 13), control the compensation storage circuitry 15 to be connected in parallel to the display storage circuitry 13, so as to compensate for the current leakage of the display storage circuitry 13, thereby pulling up the potential at the pull-up node PU to a high level and achieve the normal output of the gate driving signal.

To be specific, the compensation storage control circuitry includes: a first compensation storage control transistor, a gate electrode of which is connected to the input terminal, a first electrode of which is connected to the second terminal of the compensation storage circuitry, and a second electrode of which is connected to the pull-down control voltage terminal; and a second compensation storage control transistor, a gate electrode of which is connected to the pull-down node, a first electrode of which is connected to the pull-up node, and a second electrode of which is connected to the pull-down control voltage terminal.

Optionally, the first compensation storage control transistor and the second compensation storage control transistor are both n-type transistors.

Figure 2:
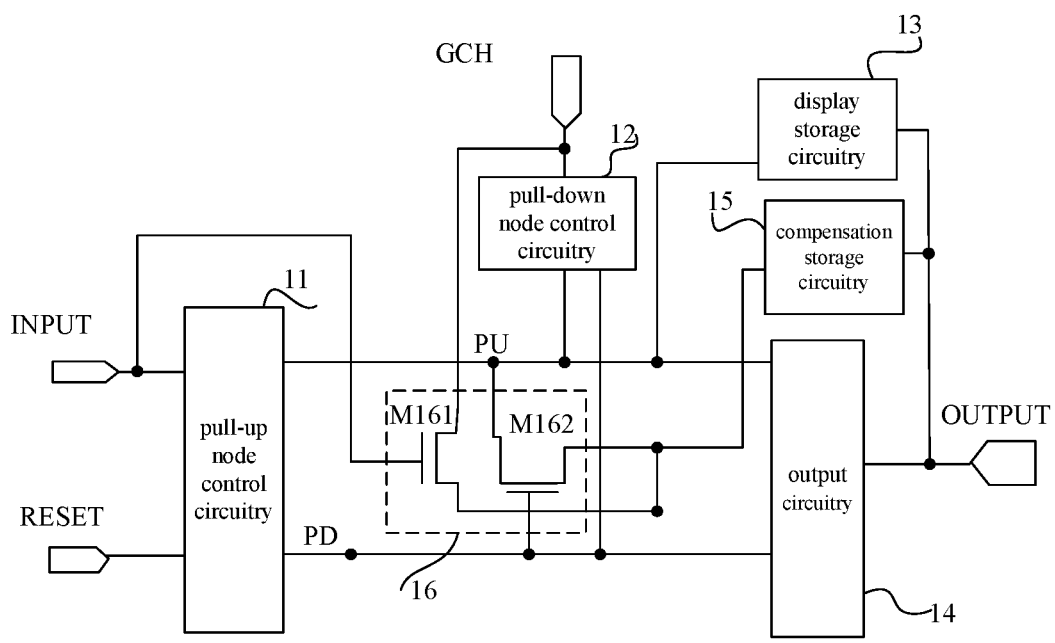
FIG. 2 is another schematic view showing a gate driving circuit according to some embodiments of the present disclosure.

To be specific, as shown in FIG. 2, on the basis of the gate driving circuit shown in FIG. 1, the compensation storage control circuitry 16 includes: a first compensation storage control transistor M161, a gate electrode of which is connected to the input terminal INPUT, a drain electrode of which is connected to the second terminal of the compensation storage circuitry 15, and a source electrode of which is connected to the pull-down control voltage terminal GCH; and a second compensation storage control transistor M162, a gate electrode of which is connected to the pull-down node PD, a drain electrode of which is connected to the pull-up node PU, and a source electrode of which is connected to the pull-down control voltage terminal GCH.

Optionally, M161 and M162 are both n-type transistors.

During the operation, the gate driving circuit in FIG. 2 may be operated at the input stage and the output stage.

At the input stage, the pull-down control voltage terminal GCH outputs a high level, and an input signal from the input terminal INPUT is a high level, so as to turn on M161, enabling the pull-down control voltage terminal GCH to be electrically connected to the second terminal of the compensation storage circuitry 15 to charge the compensation storage circuitry 15.

At the output stage, the pull-down control voltage terminal GCH outputs a high level, and in the case that the potential at the pull-up node PU is smaller than the predetermined potential (i.e., the current leakage occurs for the display storage circuitry 13), the pull-down node control circuitry 12 controls the pull-down node PD to be electrically connected to the pull-down control voltage terminal GCH, so as to control the potential at the pull-down node PD to be a high level. In the case that the potential at the pull-down node PD is a high level, M162 is turned on, so as to enable the compensation storage circuitry 15 to be electrically connected to the pull-up node PU, thereby pulling up the potential at the pull-up node PU through the compensation storage circuitry 15. In this way, it is able to compensate for the current leakage of the display storage circuitry 13 through the compensation storage circuitry 15, thereby effectively preventing the occurrence of such a circumstance where no signal is outputted from the gate driving circuit due to the current leakage of the display storage circuitry 13.

In some embodiments of the present disclosure, during the operation, the gate driving circuit in FIG. 2 may also be operated at a reset stage. At the reset stage, because the pull-down node PD is at a high potential, M162 is turned on, so as to compensate for charge leakage in the compensation storage circuitry 15. In a next frame, it is necessary to recharge the compensation storage circuit 15.

In actual use, the compensation storage circuitry 15 may include a compensation capacitor, and the display storage circuitry 13 may include a display capacitor.

Figure 3:
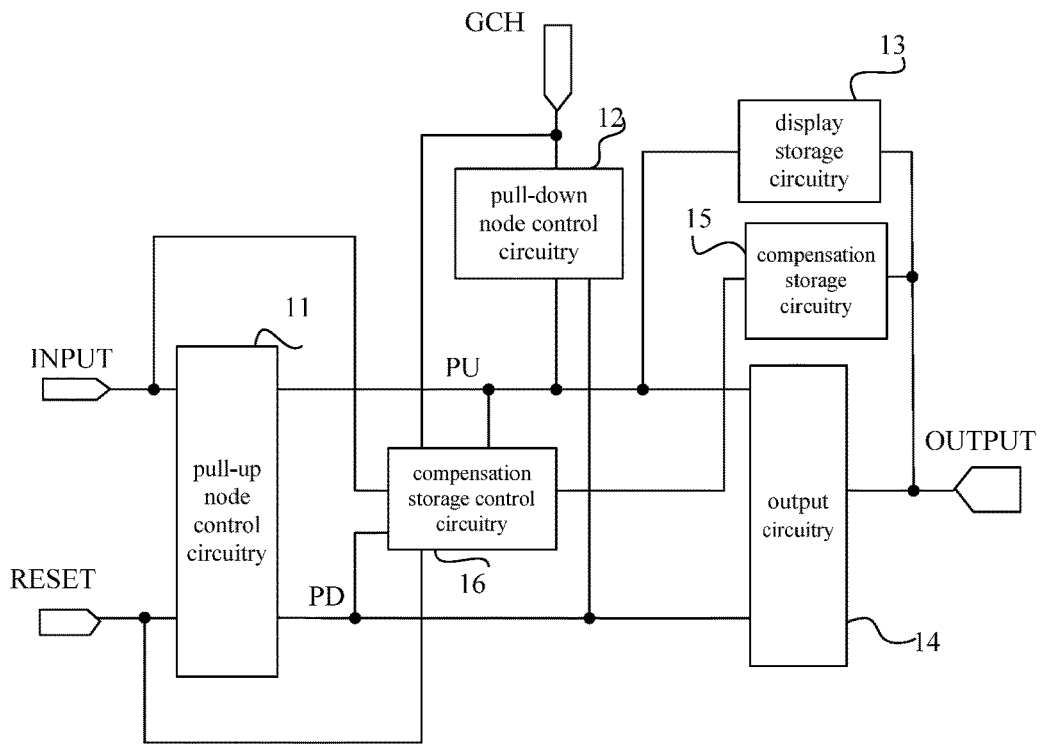
FIG. 3 is yet another schematic view showing a gate driving circuit according to some embodiments of the present disclosure.

In a possible embodiment of the present disclosure, as shown in FIG. 3, the compensation storage control circuitry 16 is further connected to the reset terminal RESET, and configured to, at the output stage, enable the second terminal of the compensation storage circuitry 15 to be electrically connected to the pull-up node PU in the case that the potential at the pull-down node PD is a high level, and at the reset stage, enable the second terminal of the compensation storage circuitry 15 to be electrically disconnected from the pull-up node PU under the control of the reset terminal RESET.

For the gate driving circuit in FIG. 3, through the compensation storage control circuitry 16, the charges stored in the compensation storage circuitry 15 may not be discharged at the reset stage, and thus the pull-down control voltage terminal GCH may output a low level after a reset stage and before a start of a next frame. As a result, in the case that the potential at the pull-down node PD is kept as a low level after the reset stage, it is unnecessary to recharge the compensation storage circuitry 15 in the next frame, thereby reducing power consumption.

To be specific, the compensation storage control circuitry includes: a first compensation storage control transistor, a gate electrode of which is connected to the input terminal, a first electrode of which is connected to the second terminal of the compensation storage circuitry, and a second electrode of which is connected to the pull-down control voltage terminal; a second compensation storage control transistor, a gate electrode of which is connected to a compensation control node, a first electrode of which is connected to the pull-up node, and a second electrode of which is connected to the pull-down control voltage terminal; a third compensation storage control transistor, a gate electrode and a first electrode of which are connected to the pull-down node, and a second electrode of which is connected to the compensation control node; and a fourth compensation storage control transistor, a gate electrode of which is connected to the reset terminal, a first electrode of which is connected to the compensation control node, and a second electrode of which is connected to a first low level output terminal.

To be specific, the first compensation storage control transistor, the second compensation storage control transistor, the third compensation storage control transistor and the fourth compensation storage control transistor are all n-type transistors.

Figure 4:
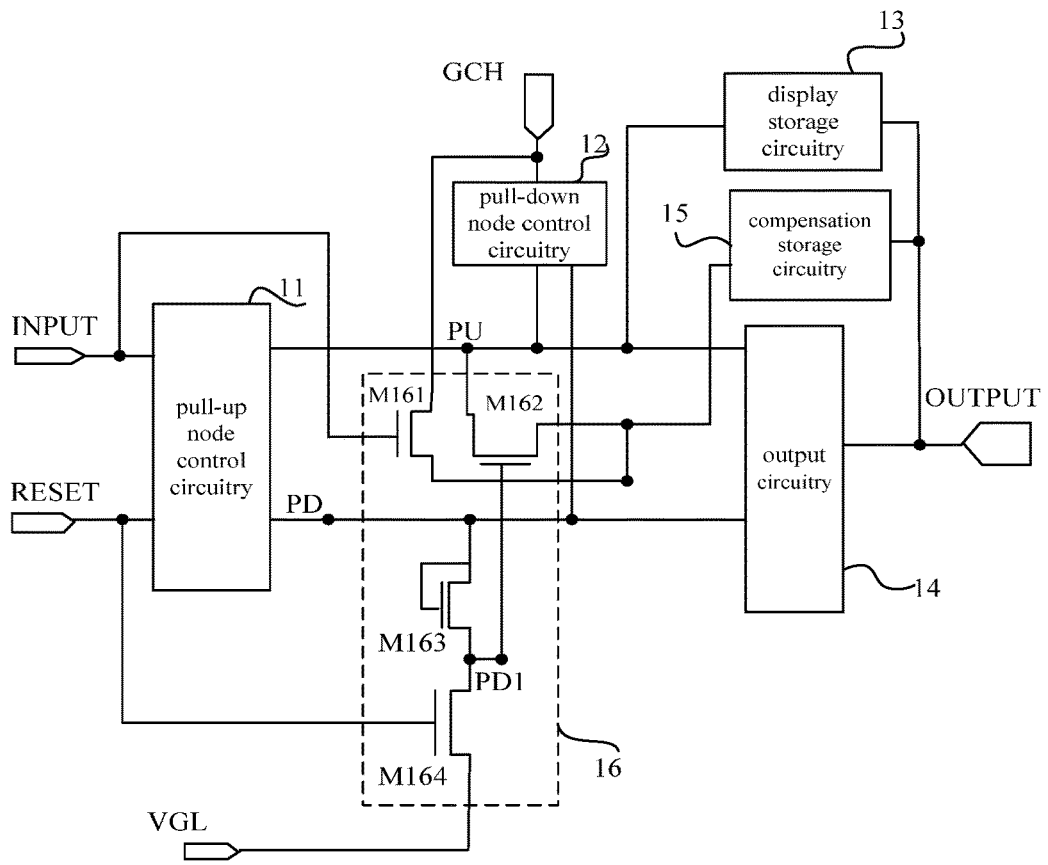
FIG. 4 is still yet another schematic view showing a gate driving circuit according to some embodiments of the present disclosure.

As shown in FIG. 4, on the basis of the gate driving circuit in FIG. 1, the compensation storage control circuitry includes: a first compensation storage control transistor M161, a gate electrode of which is connected to the input terminal INPUT, a drain electrode of which is connected to the second terminal of the compensation storage circuitry 15, and a source electrode of which is connected to the pull-down control voltage terminal GCH; a second compensation storage control transistor M162, a gate electrode of which is connected to a compensation control node PD1, a drain electrode of which is connected to the pull-up node PU, and a source electrode of which is connected to the pull-down control voltage terminal GCH; a third compensation storage control transistor M163, a gate electrode and a drain electrode of which are connected to the pull-down node PD, and a source electrode of which is connected to the compensation control node PD1; and a fourth compensation storage control transistor M164, a gate electrode of which is connected to the reset terminal RESET, a drain electrode of which is connected to the compensation control node PD1, and a source electrode of which is connected to a first low level output terminal for outputting a first low level VGL.

In a possible embodiment of the present disclosure, M161, M162, M163 and M164 are all n-type transistors.

As compared with FIG. 2, the gate driving circuit in FIG. 4 includes additional M163 and M164. PD1 represents the compensation control node. At the output stage, in the case that the potential at PD is a high level, M163 is turned on, so that the potential at PD1 is also a high level and M162 is turned on. At the reset stage, the reset terminal RESET outputs a high level, so as to turn on M164. A width-to-length ratio of M163 and a width-to-length ratio of M164 are set in such a manner as to enable the potential at PD1 is a low level, so as to turn off M12. At this time, the charges stored in the compensation storage circuitry 15 may not be released, and thus it is able for the pull-down control voltage terminal GCH to output a low level after the reset stage and before the star of the next frame. As a result, in the case that the potential at the pull-down node PD is kept as the low level after the reset stage, it is unnecessary to recharge the compensation storage circuitry in the next frame, thereby reducing the power consumption.

To be specific, the compensation storage circuitry may include a compensation capacitor.

In actual use, the pull-down node control circuitry 12 is further configured to enable the pull-down node PD to be electrically connected to the first low level input terminal in the case that the potential at the pull-up node PU is greater than the predetermined potential, and enable the pull-down node PD to be electrically connected to the pull-down control voltage terminal GCH in the case that the potential at the pull-up node PU is smaller than the predetermined potential and the pull-down control voltage terminal GCH outputs a high level.

To be specific, the pull-down node control circuitry includes: a first pull-down control transistor, a gate electrode of which is connected to the pull-up node, a first electrode of which is connected to the pull-down node, and a second electrode of which is connected to the first low level input terminal; a second pull-down control transistor, a gate electrode of which is connected to the pull-up node, a first electrode of which is connected to a pull-down control node, and a second electrode of which is connected to the first low level input terminal; a third pull-down control transistor, a gate electrode and a first electrode of which are connected to the pull-down control voltage terminal, and a second electrode of which is connected to the pull-down control node; and a fourth pull-down control transistor, a gate electrode of which is connected to the pull-down control node, a first electrode of which is connected to the pull-down control voltage terminal, and a second electrode of which is connected to the pull-down node.

Figure 5:
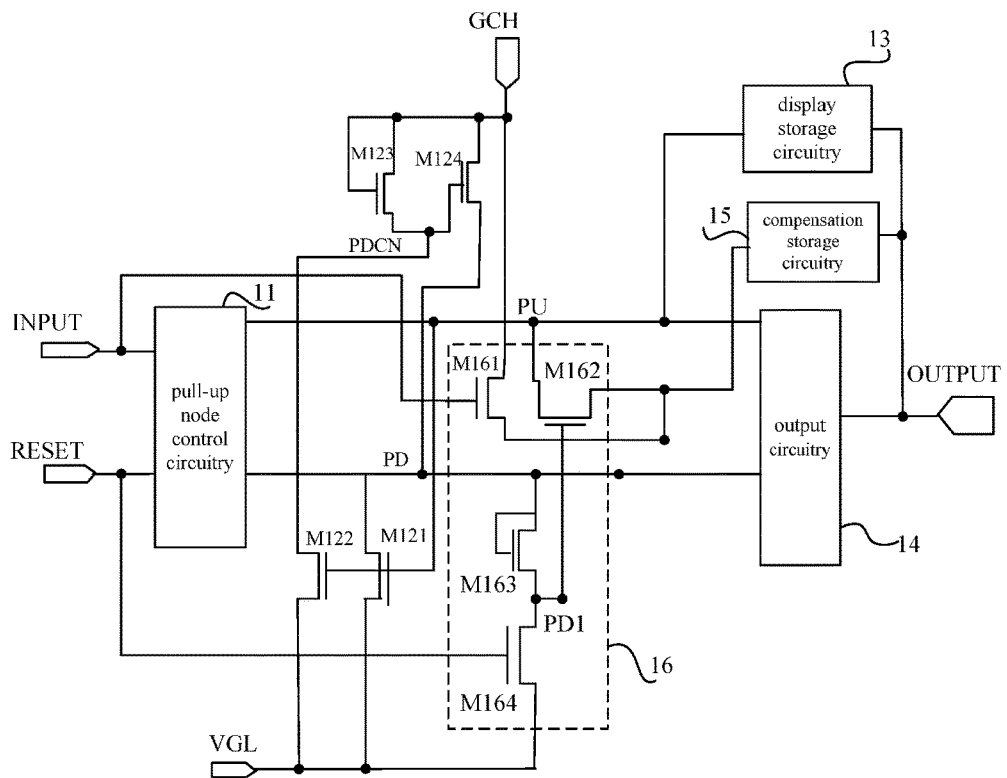
FIG. 5 is still yet another schematic view showing a gate driving circuit according to some embodiments of the present disclosure.

As shown in FIG. 5, on the basis of the gate driving circuit in FIG. 4, the pull-down node control circuitry includes: a first pull-down control transistor M121, a gate electrode of which is connected to the pull-up node PU, a drain electrode of which is connected to the pull-down node PD, and a source electrode of which is connected to the first low level input terminal for outputting the first low level VGL; a second pull-down control transistor M122, a gate electrode of which is connected to the pull-up node PU, a drain electrode of which is connected to a pull-down control node PDCN, and a source electrode of which is connected to the first low level input terminal for outputting the first low level VGL; a third pull-down control transistor M123, a gate electrode and a drain electrode of which are connected to the pull-down control voltage terminal GCH, and a source electrode of which is connected to the pull-down control node PDCN; and a fourth pull-down control transistor M124, a gate electrode of which is connected to the pull-down control node PDCN, a drain electrode of which is connected to the pull-down control voltage terminal GCH, and a source electrode of which is connected to the pull-down node PD.

In a possible embodiment of the present disclosure, M121, M122, M123 and M124 are all n-type transistors.

During the operation, the gate driving circuit in FIG. 5 may be operated at the input stage, the output stage and the reset stage.

At the input stage, GCH outputs a high level, and INPUT outputs a high level, so as to turn on M161, thereby charging the compensation storage circuitry 15. At the output stage, GCH outputs a high level.

In the case that the current leakage occurs in the display storage circuitry 13, the potential at PU may decreases, so M121 and M122 may be turned off, and M123 and M124 may be turned on. PDCH may be connected to GCH, and PD may be connected to GCH, so the potential at PD and the potential at PD1 may be each a high level. At this time, M162 may be turned on, and the compensation storage circuitry 15 in a full charge state may be connected in parallel to the display storage circuitry 13, so as to compensate for the current leakage of the display storage circuitry 13 and to maintain PU at a high level, thereby ensuring the normal output of the gate driving circuit.

At the reset stage, GCH outputs a high level and RESET outputs a high level, so the potential at PU may be pulled down and the potential at PD may be pulled up. At this time, M164 may be turned on. Through designing a ratio between a width-to-length ratio of M163 and a width-to-length ratio of M164, the potential at PD1 may be maintained as a low potential, and M162 is turned off, so as to interrupt a discharge path of the compensation storage circuitry 15, thereby restoring the compensation storage circuitry 15 to a full-charge and standby state. At this time, the compensation storage circuitry 15 does not operate.

Figure 6:
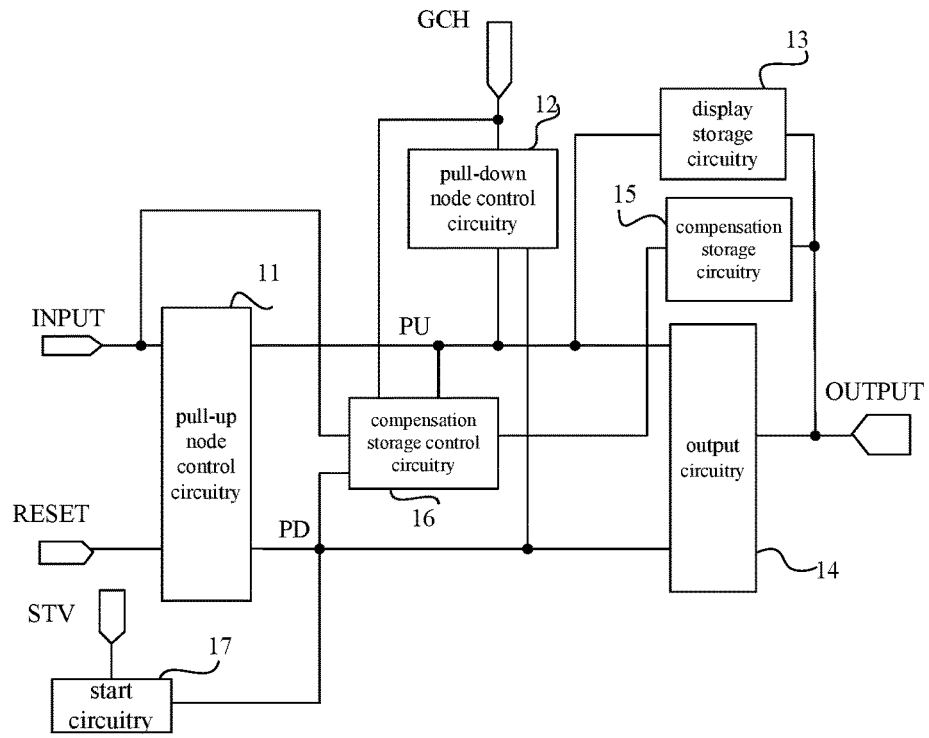
FIG. 6 is still yet another schematic view showing a gate driving circuit according to some embodiments of the present disclosure.

To be specific, as shown in FIG. 6, on the basis of the gate driving circuit in FIG. 1, the gate driving circuit further includes a start circuitry 17 connected to a start terminal STV and the pull-down node PD, and configured to, prior to the input stage of a display duration of each frame, control the potential at the pull-down node PD to be a high level under the control of the start terminal STV, so as to denoise the pull-up node PU and the gate driving signal output terminal OUTPUT.

During the implementation, the start circuitry may include a start transistor, a gate electrode and a drain electrode of which are connected to the start terminal, and a source electrode of which is connected to the pull-down node.

The gate driving circuit in the embodiments of the present disclosure will be described hereinafter in more details.

Figure 7:
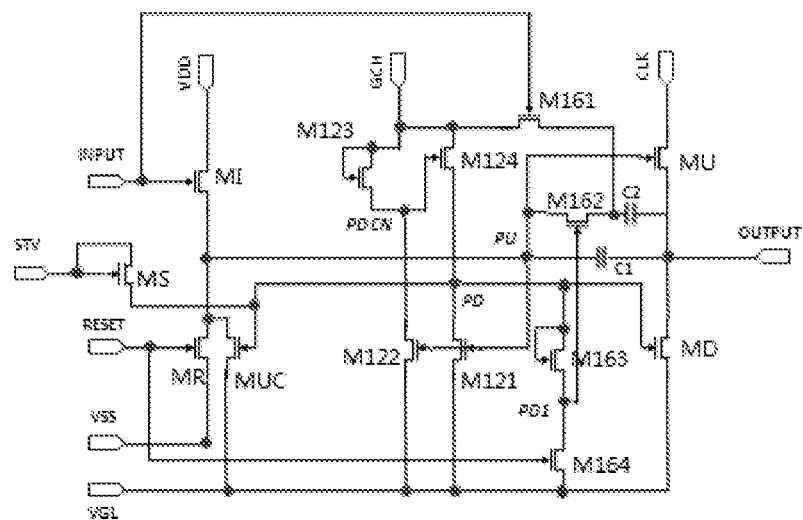
FIG. 7 is a circuit diagram of a gate driving circuit according to some embodiments of the present disclosure.

As shown in FIG. 7, the gate driving circuit includes a pull-up node control circuitry, a pull-down node control circuitry, a display storage circuitry, an output circuitry, a compensation storage circuitry, a compensation storage control circuitry and a start circuitry.

The pull-up node control circuitry includes: an input transistor MI, a gate electrode of which is connected to an input terminal INPUT, a drain electrode of which is connected to a high level input terminal for outputting a high level VDD, and a source electrode of which is connected to a pull-up node PU; a resetting transistor MR, a gate electrode of which is connected to a reset terminal RESET, a drain electrode of which is connected to the pull-up node PU, and a source electrode of which is connected to a second low level input terminal for outputting a second low level VSS; and a pull-up node control transistor MUC, a gate electrode of which is connected to a pull-down node PD, a drain electrode of which is connected to the pull-up node PU, and a source electrode of which is connected to a first low level input terminal for outputting a first low level VGL.

The pull-down node control circuitry includes: a first pull-down control transistor M121, a gate electrode of which is connected to the pull-up node PU, a drain electrode of which is connected to the pull-down node PD, and a source electrode of which is connected to the first low level input terminal for outputting the first low level VGL; a second pull-down control transistor M122, a gate electrode of which is connected to the pull-up node PU, a drain electrode of which is connected to a pull-down control node PDCN, and a source electrode of which is connected to the first low level input terminal for outputting the first low level VGL; a third pull-down control transistor M123, a gate electrode and a drain electrode of which are connected to a pull-down control voltage terminal GCH, and a source electrode of which is connected to the pull-down control node PDCN; and a fourth pull-down control transistor M124, a gate electrode of which is connected to the pull-down control node PDCN, a drain electrode of which is connected to the pull-down control voltage terminal GCH, and a source electrode of which is connected to the pull-down node PD.

The display storage circuitry includes a display storage capacitor C1, a first terminal of which is connected to the pull-up node PU, and a second terminal of which is connected to a gate driving signal output terminal OUTPUT.

The output circuitry includes: a pull-up transistor MU, a gate electrode of which is connected to the pull-up node PU, a drain electrode of which is connected to a clock signal input terminal CLK, and a source electrode of which is connected to the gate driving signal output terminal OUTPUT; and a pull-down transistor MD, a gate electrode of which is connected to the pull-down node PD, a drain electrode of which is connected to the gate driving signal output terminal OUTPUT, and a source electrode of which is connected to the first low level input terminal.

The compensation storage circuitry includes a compensation storage capacitor C2, a first terminal of which is connected to the gate driving signal output terminal OUTPUT.

The compensation storage control circuitry includes: a first compensation storage control transistor M161, a gate electrode of which is connected to the input terminal INPUT, a drain electrode of which is connected to a second terminal of the compensation storage circuitry 15, and a source electrode of which is connected to the pull-down control voltage terminal GCH; a second compensation storage control transistor M162, a gate electrode of which is connected to a compensation control node PD1, a drain electrode of which is connected to the pull-up node PU, and a source electrode of which is connected to the pull-down control voltage terminal GCH; a third compensation storage control transistor M163, a gate electrode and a drain electrode of which are connected to the pull-down node PD, and a source electrode of which is connected to the compensation control node PD1; and a fourth compensation storage control transistor M164, a gate electrode of which is connected to a reset terminal RESET, a drain electrode of which is connected to the compensation control node PD1, and a source electrode of which is connected to the first low level input terminal for outputting the first low level VGL.

The start circuitry includes a start transistor MS, a gate electrode and a drain electrode of which are connected to a start terminal STV, and a source electrode of which is connected to the pull-down node PD.

In FIG. 7, all the transistors are n-type transistors.

As compared with a conventional gate driving circuit, the gate driving circuit in FIG. 7 includes the additional compensation storage capacitor C2 as well as matching M161, M162, M163, M164 and PD1 for controlling the compensation storage circuitry 15. C2 is connected to GCH, and it is in a full-charge and standby state at the output stage for outputting the gate driving signal. In the embodiment of the gate driving circuit as shown in FIG. 7 of the present disclosure, in the case that the gate driving circuit operates normally, it is able to ensure that C2 is in the standby state, without any additional power consumption for the gate driving circuit. In the case that the abnormal output occurs due to the current leakage of C1, C2 may be used to enhance the output of the gate driving circuit and compensate for the current leakage of C1, so as to ensure the normal output of the gate driving circuit.

Figure 8:
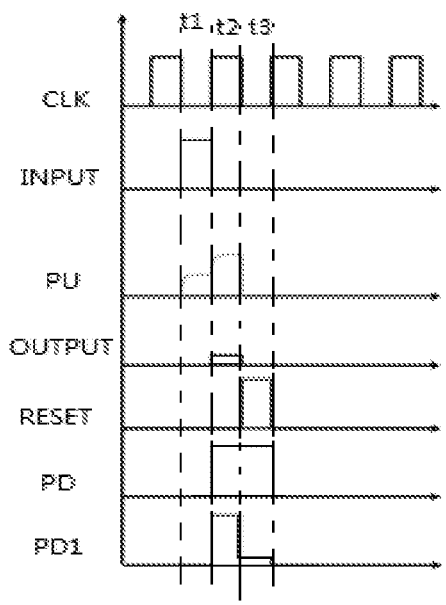
FIG. 8 is a sequence diagram of the gate driving circuit in FIG. 7 in the case that a current leakage occurs in a display storage circuitry.

As shown in FIG. 8, it is presumed that the current leakage occurs in the display storage capacitor C1 at the output stage t2.

At the input stage t1, INPUT outputs a high level, RESET outputs a low level, and GCH outputs a high level. At this time, MI and M161 are turned on, so C1 is charged by VDD through MI in the on state, and C2 is charged by GCH through M161 in the on state, so that C2 is in the full-charge and standby state after a charging operation has been completed.

At the output stage t2, INPUT outputs a low level, RESET outputs a low level (so as to turn off MI and M161), and GCH outputs a high level. At this time, the potential at PU is maintained by C1, and in the case that the potential at PU decreases due to the current leakage of C1, M121 and M122 are turned off, so as to pull up the potential of PDCN to a high level through M123 in the on state, thereby turning on M124 and pulling up the potential at PD to a high level. At this time, M163 is turned on, so the potential at PD1 is also a high level, so as to turn on M162, enabling the second terminal of C2 to be electrically connected to the pull-up node PU. C1 is connected in parallel to C2, the charge leakage of C1 is compensated through C2 in the full-charge and standby state, so as to maintain the potential at PU as a high potential, thereby ensuring the normal output of the gate driving circuit, as shown in FIG. 9 (the potential at PU pulled up to a high level, as well as a waveform normally output by OUTPUT, at the output stage t2, is not shown in FIG. 8).

At the reset stage t3, INPUT outputs a low level, RESET outputs a high level, GCH outputs a high level, MR and M164 are turned on, and the potential at PU is pulled down to VSS through MR. At this time, M121 and M122 are turned off, and M123 is turned on, so that the potential at PDCN is pulled up to a high level. M124 is turned on, and thus the potential at PD is also pulled up to a high level, and M163 and M164 are turned on. By setting a ratio between a width-to-length ratio of M163 and a width-to-length ratio of M164, the potential at PD1 may be maintained as a low level. At this time, M162 is turned off, so as to interrupt a discharge path of C2, thereby restoring the compensation storage circuitry 15 to the full-charge and standby state. The compensation storage circuitry 15 does not operate.

In actual use, in a possible embodiment of the present disclosure, after the reset stage t3 and before the star of a next frame, GCH outputs a low level, so as to ensure that the potential at PD is a low level, thereby controlling the potential at PD1 to be a low level. At this time, M162 is not turned on and C2 is not discharged, so it is unnecessary to recharge C2 in a next frame, thereby reducing the power consumption.

As shown in FIG. 9, it is presumed that the gate driving circuit in FIG. 7 operates normally.

At the input stage t1, INPUT outputs a high level, RESET outputs a low level and GCH outputs a high level. At this time, MI and M161 are turned on, and C1 is charged by VDD through MI in the on state, and C2 is charged by GCH through M161 in the on state, so that C2 is in the full-charge and standby state after the charging operation has been completed.

At the output stage t2, INPUT outputs a low level, RESET outputs a low level (so as to turn on MI and M161), and GCH outputs a high level. At this time, the potential at PU is maintained by C1, and in the case that the current leakage does not occur in C1, the potential at PU is maintained by C1 as a high level, and OUTPUT normally outputs a high level. M121, M122 and M123 are turned on, and a width-to-length ratio of M123 and a width-to-length ratio of M122 are set in such a manner as to enable the potential at PDCH to be a low level. M121 is turned on, so that the potential at PD is a low level, and the potential at PD1 is a low level. At this time, C2 does not operate.

At the reset stage t3, INPUT outputs a low level, RESET outputs a high level, and GCH outputs a high level. MR is turned on, so as to pull down the potential at PU and pull up the potential at PD, enabling OUTPUT to output a low level. At this time, M163 is turned on, by setting a ratio between a width-to-length ratio of M163 and a width-to-length ratio of M164, the potential at PD1 is maintained t as a low potential, and M162 is controlled to be turned off.

As shown in FIG. 10, the present disclosure further provides in some embodiments a gate driving method for the above-mentioned gate driving circuit. The display duration of one frame includes the input stage and the output stage. The gate driving method includes following steps.

In step S1, at the input stage, a high level is output by the pull-down control voltage terminal, and the pull-down control voltage terminal is controlled by the compensation storage control circuitry to be electrically connected to the second terminal of the compensation storage circuitry under the control of the input terminal, so as to charge the compensation storage circuitry.

In step S2, at the output stage, a high level is output by the pull-down control voltage terminal to output, the pull-down node is controlled by the pull-down node control circuitry to be electrically connected to the pull-down control voltage terminal in the case that the potential at the pull-up node is smaller than a predetermined potential, so as to control the potential at the pull-down node to be a high level, and the second terminal of the compensation storage circuitry is controlled by the compensation storage control circuitry to be electrically connected to the pull-up node in the case that the potential at the pull-down node is a high level, so as to pull up the potential at the pull-up node through the compensation storage circuitry.

According to the gate driving method shown in FIG. 10 of the present disclosure, during operation, at the output stage, in the case that the current leakage occurs in the display storage circuitry, i.e., in the case that the potential at the pull-up node is smaller than the predetermined potential, the potential at the pull-up node may be pulled up through the compensation storage circuitry that has been charged, so as to ensure the normal output of the gate driving signal.

Figure 11:
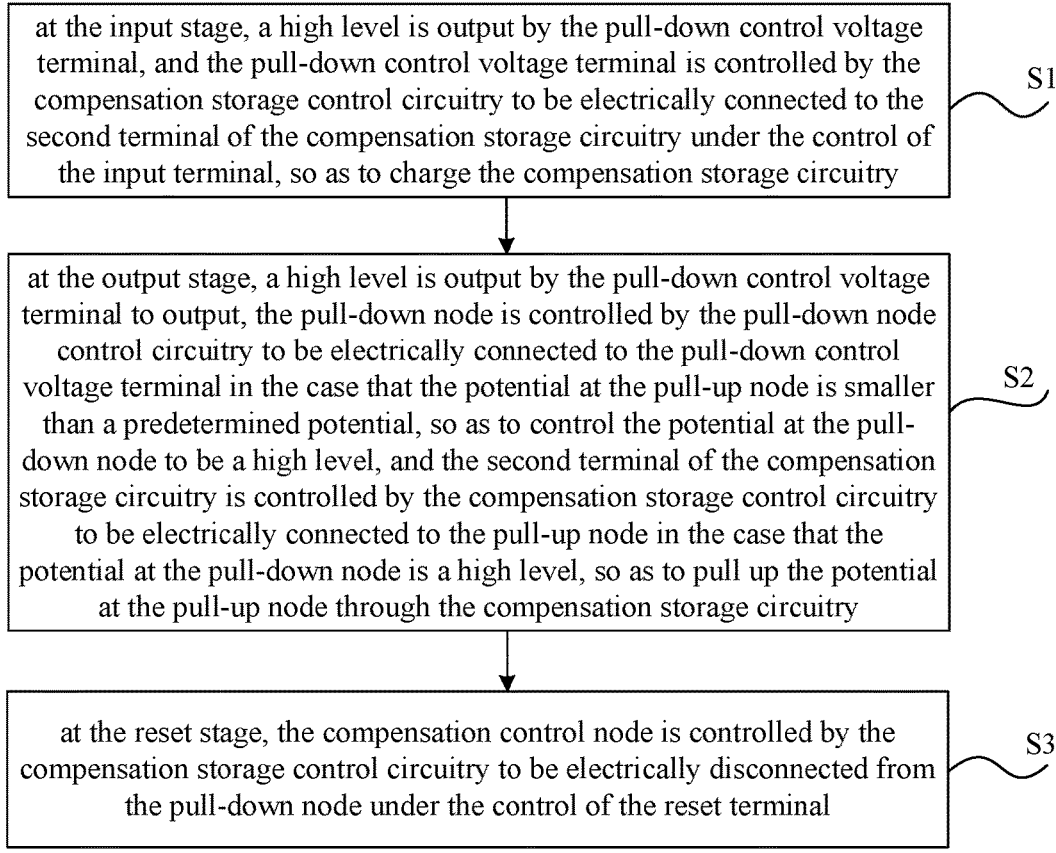
FIG. 11 is a flow chart of the gate driving method according to some embodiments of the present disclosure.

As shown in FIG. 11, the present disclosure further provides in some embodiments a gate driving method for the above-mentioned gate driving circuit. The display duration of one frame includes the input stage, the output stage and the reset stage. The gate driving method includes following steps.

In step S1, at the input stage, a high level is output by the pull-down control voltage terminal, and the pull-down control voltage terminal is controlled by the compensation storage control circuitry to be electrically connected to the second terminal of the compensation storage circuitry under the control of the input terminal, so as to charge the compensation storage circuitry.

In step S2, at the output stage, a high level is output by the pull-down control voltage terminal to output, the pull-down node is controlled by the pull-down node control circuitry to be electrically connected to the pull-down control voltage terminal in the case that the potential at the pull-up node is smaller than a predetermined potential, so as to control the potential at the pull-down node to be a high level, and the second terminal of the compensation storage circuitry is controlled by the compensation storage control circuitry to be electrically connected to the pull-up node in the case that the potential at the pull-down node is a high level, so as to pull up the potential at the pull-up node through the compensation storage circuitry.

In step S3, at the reset stage, the compensation control node is controlled by the compensation storage control circuitry to be electrically disconnected from the pull-down node under the control of the reset terminal.

According to the gate driving method shown in FIG. 11 applied to the gate driving circuit shown in FIG. 3 of the present disclosure, during operation, at the output stage, in the case that the current leakage occurs in the display storage circuitry, i.e., in the case that the potential at the pull-up node is smaller than the predetermined potential, the potential at the pull-up node may be pulled up through the compensation storage circuitry that has been charged, so as to ensure the normal output of the gate driving signal. In addition, the compensation control node is electrically disconnected from the pull-down node at the reset stage through the compensation storage control circuitry, so as to prevent the charges stored in the compensation storage circuitry from being discharged, thereby to enable the pull-down control voltage terminal to output a low level after the reset stage and before the star of the next frame. As a result, in the case that the potential at the pull-down node is maintained as a low level after the reset stage, it is unnecessary to recharge the compensation storage circuitry in the next frame, thereby reducing the power consumption.

To be specific, the display time period within each frame further includes the reset stage. The gate driving method further includes following steps: at the reset stage, outputting, by the pull-down control voltage terminal, a high level, and under the control of the reset terminal, controlling, by the pull-up node control circuitry the potential at the pull-up node to be a low level, and controlling, by the pull-down node control circuitry, the pull-down node to be electrically connected to the pull-down control voltage terminal, so as to control the potential at the pull-down node to be a high level.

In a possible embodiment of the present disclosure, the gate driving method further includes following steps: subsequent to the reset stage, outputting, by the pull-down control voltage terminal, controlling, by the pull-down node control circuitry, the potential at the pull-down node to be a low level, and controlling, by the compensation storage control circuitry, the second terminal of the compensation storage circuitry to be electrically disconnected from the pull-up node.

In a possible embodiment of the present disclosure, after the reset stage, the pull-down control voltage terminal may output a low level, so as to enable the second terminal of the compensation storage circuitry to be electrically disconnected from the pull-up node all the time, thereby to prevent the charges stored in the compensation storage circuitry from being discharged. As a result, it is unnecessary to recharge the compensation storage capacitor in the next frame, thereby remarkably reducing the power consumption of the entire gate driving circuit.

The present disclosure further provides in some embodiments a display device including the above-mentioned gate driving circuit.

The above are merely the preferred embodiments of the present disclosure, and it should be noted that, a person skilled in the art may make further modifications and improvements without departing from the spirit of the present disclosure, and these modifications and improvements shall also fall within the scope of the present disclosure.

What is claimed is:

1. A gate driving circuit, comprising:
    a pull-up node control circuitry connected to an input terminal, a pull-up node and a pull-down node;
    a pull-down node control circuitry connected to a pull-down control voltage terminal, the pull-up node and the pull-down node;
    a display storage circuitry, a first terminal of which is connected to the pull-up node and a second terminal of which is connected to a gate driving signal output terminal;
    a compensation storage circuitry, a first terminal of which is connected to the gate driving signal output terminal; and
    a compensation storage control circuitry, wherein
    the pull-up node control circuitry is configured to enable the pull-down node to be connected to the pull-down control voltage terminal, so as to control a potential at the pull-down node to be a high level, and
    the compensation storage control circuitry is connected to the input terminal, the pull-down control voltage terminal, the pull-up node, the pull-down node and a second terminal of the compensation storage circuitry, and configured to enable the pull-down control voltage terminal to be electrically connected to the second terminal of the compensation storage circuitry under the control of the input terminal so as to charge the compensation storage circuitry, and enable the second terminal of the compensation storage circuitry to be electrically connected to the pull-up node.

2. The gate driving circuit according to claim 1, wherein the pull-up node control circuitry is further configured to, in the case that a potential at the pull-up node is smaller than a predetermined potential, enable the pull-down node to be electrically connected to the pull-down control voltage terminal at an output stage, so as to control the potential at the pull-down node to be a high level; and
    the compensation storage control circuitry is further configured to enable the pull-down control voltage terminal to be electrically connected to the second terminal of the compensation storage circuitry under the control of the input terminal at an input stage so as to charge the compensation storage circuitry, and in the case that the potential at the pull-down node is a high level, enable the second terminal of the compensation storage circuitry to be electrically connected to the pull-up node at the output stage.

3. The gate driving circuit according to claim 1, wherein the compensation storage control circuitry comprises:
    a first compensation storage control transistor, a gate electrode of which is connected to the input terminal, a first electrode of which is connected to the second terminal of the compensation storage circuitry, and a second electrode of which is connected to the pull-down control voltage terminal; and
    a second compensation storage control transistor, a gate electrode of which is connected to the pull-down node, a first electrode of which is connected to the pull-up node, and a second electrode of which is connected to the pull-down control voltage terminal.

4. The gate driving circuit according to claim 3, wherein the first compensation storage control transistor and the second compensation storage control transistor are both n-type transistors.

5. The gate driving circuit according to claim 2, wherein the pull-up node control circuitry is further connected to a reset terminal, and the compensation storage control circuitry is further connected to the reset terminal and configured to enable the second terminal of the compensation storage circuitry to be electrically disconnected from the pull-up node under the control of the reset terminal at a reset stage.

6. The gate driving circuit according to claim 5, wherein the compensation storage control circuitry comprises:
    a first compensation storage control transistor, a gate electrode of which is connected to the input terminal, a first electrode of which is connected to the second terminal of the compensation storage circuitry, and a second electrode of which is connected to the pull-down control voltage terminal;
    a second compensation storage control transistor, a gate electrode of which is connected to a compensation control node, a first electrode of which is connected to the pull-up node, and a second electrode of which is connected to the pull-down control voltage terminal;
    a third compensation storage control transistor, a gate electrode and a first electrode of which are connected to the pull-down node, and a second electrode of which is connected to the compensation control node; and
    a fourth compensation storage control transistor, a gate electrode of which is connected to the reset terminal, a first electrode of which is connected to the compensation control node, and a second electrode of which is connected to a first low level output terminal.

7. The gate driving circuit according to claim 6, wherein at the reset stage, a potential at the compensation control node is controlled in accordance with a width-to-length ratio of the third compensation storage control transistor and a width-to-length ratio of the fourth compensation storage control transistor.

8. The gate driving circuit according to claim 6, wherein the first compensation storage control transistor, the second compensation storage control transistor, the third compensation storage control transistor and the fourth compensation storage control transistor are all n-type transistors.

9. The gate driving circuit according to claim 1, wherein the compensation storage circuitry comprises a compensation capacitor.

10. The gate driving circuit according to claim 1, wherein the pull-down node control circuitry is further configured to enable the pull-down node to be electrically connected to a first low level input terminal in the case that the potential at the pull-up node is greater than the predetermined potential, and control the pull-down node to be electrically connected to the pull-down control voltage terminal in the case that the potential at the pull-up node is smaller than a predetermined potential and the pull-down control voltage terminal outputs a high level.

11. The gate driving circuit according to claim 10, wherein the pull-down node control circuitry comprises:
a first pull-down control transistor, a gate electrode of which is connected to the pull-up node, a first electrode of which is connected to the pull-down node, and a second electrode of which is connected to the first low level input terminal;
a second pull-down control transistor, a gate electrode of which is connected to the pull-up node, a first electrode of which is connected to a pull-down control node, and a second electrode of which is connected to the first low level input terminal;
a third pull-down control transistor, a gate electrode and a first electrode of which are connected to the pull-down control voltage terminal, and a second electrode of which is connected to the pull-down control node; and
a fourth pull-down control transistor, a gate electrode of which is connected to the pull-down control node, a first electrode of which is connected to the pull-down control voltage terminal, and a second electrode of which is connected to the pull-down node.

12. The gate driving circuit according to claim 1, further comprising a start circuitry connected to a start terminal and the pull-down node, and configured to, prior to an input stage, control the potential at the pull-down node to be a high level under the control of the start terminal, so as to denoise the pull-up node and the gate driving signal output terminal.

13. The gate driving circuit according to claim 1, further comprising an output circuitry connected to the pull-up node, the pull-down node, the gate driving signal output terminal, a first low level output terminal and a clock signal connection terminal, and configured to enable the gate driving signal output terminal to be electrically connected to the first low level output terminal and/or the clock signal connection terminal under the control of the pull-up node and the pull-down node.

14. A gate driving method for the gate driving circuit according to claim 2, wherein a display duration of one frame comprises the input stage and the output stage, and
the gate driving method comprises steps of:
at the input stage, outputting, by the pull-down control voltage terminal, a high level, and controlling, by the compensation storage control circuitry, the pull-down control voltage terminal to be electrically connected to the second terminal of the compensation storage circuitry under the control of the input terminal, so as to charge the compensation storage circuitry; and
at the output stage, outputting, by the pull-down control voltage terminal, a high level, controlling, by the pull-down node control circuitry, the pull-down node to be electrically connected to the pull-down control voltage terminal in the case that the potential at the pull-up node is smaller than the predetermined potential, so as to control the potential at the pull-down node to be a high level, and controlling, by the compensation storage control circuitry, the second terminal of the compensation storage circuitry to be electrically connected to the pull-up node in the case that the potential at the pull-down node is a high level, so as to pull up the potential at the pull-up node through the compensation storage circuitry.

15. A gate driving method for the gate driving circuit according to claim 5, wherein a display duration of one frame includes the input stage, the output stage and the reset stage, and
the gate driving method comprises steps of:
at the input stage, outputting, by the pull-down control voltage terminal, a high level, and controlling, by the compensation storage control circuitry, the pull-down control voltage terminal to be electrically connected to the second terminal of the compensation storage circuitry under the control of the input terminal, so as to charge the compensation storage circuitry;
at the output stage, outputting, by the pull-down control voltage terminal, a high level, controlling, by the pull-down node control circuitry, the pull-down node to be electrically connected to the pull-down control voltage terminal in the case that the potential at the pull-up node is smaller than a predetermined potential, so as to control the potential at the pull-down node to be a high level, and controlling, by the compensation storage control circuitry, the second terminal of the compensation storage circuitry to be electrically connected to the pull-up node in the case that the potential at the pull-down node is a high level, so as to pull up the potential at the pull-up node through the compensation storage circuitry; and
at the reset stage, controlling, by the compensation storage control circuitry, the compensation control node to be electrically disconnected from the pull-down node under the control of the reset terminal.

16. The gate driving method according to claim 15, further comprising: at the reset stage, outputting, by the pull-down control voltage terminal, a high level, and under the control of the reset terminal, controlling, by the pull-up node control circuitry, the potential at the pull-up node to be a low level, and controlling, by the pull-down node control circuitry, the pull-down node to be electrically connected to the pull-down control voltage terminal, so as to control the potential at the pull-down node to be a high level.

17. The gate driving method according to claim 16, further comprising: subsequent to the reset stage, outputting, by the pull-down control voltage terminal, a low level, controlling, by the pull-down node control circuitry, the potential at the pull-down node to be a low level, and controlling, by the compensation storage control circuitry, the second terminal of the compensation storage circuitry to be electrically disconnected from the pull-up node.

18. A display device comprising the gate driving circuit according to claim 1.

* * * * *